(12) United States Patent
Buono

(10) Patent No.: US 11,017,932 B2
(45) Date of Patent: May 25, 2021

(54) INDUCTOR APPARATUS OPTIMIZED FOR LOW POWER LOSS IN CLASS-D AUDIO AMPLIFIER APPLICATIONS AND METHOD FOR MAKING THE SAME

(71) Applicant: Crestron Electronics, Inc., Rockleigh, NJ (US)

(72) Inventor: Robert N. Buono, Ringwood, NJ (US)

(73) Assignee: Crestron Electronics, Inc., Rockleigh, NJ (US)

( * ) Notice: Subject to any disclaimer, the term of this patent is extended or adjusted under 35 U.S.C. 154(b) by 0 days.

(21) Appl. No.: 16/436,465

(22) Filed: Jun. 10, 2019

(65) Prior Publication Data

US 2020/0388427 A1    Dec. 10, 2020

(51) Int. Cl.
| | |
|---|---|
| *H03F 3/187* | (2006.01) |
| *H01F 17/04* | (2006.01) |
| *H03F 3/217* | (2006.01) |
| *H01F 27/28* | (2006.01) |
| *H01F 27/26* | (2006.01) |
| *H03F 1/26* | (2006.01) |
| *H03H 7/01* | (2006.01) |

(52) U.S. Cl.
CPC ........... *H01F 17/04* (2013.01); *H01F 27/263* (2013.01); *H01F 27/266* (2013.01); *H01F 27/2828* (2013.01); *H03F 1/26* (2013.01); *H03F 3/217* (2013.01); *H03H 7/0115* (2013.01); *H03F 2200/03* (2013.01); *H03F 2200/267* (2013.01)

(58) Field of Classification Search
CPC ...................................................... H03F 3/187
USPC .................................................... 330/307, 67
See application file for complete search history.

(56) References Cited

U.S. PATENT DOCUMENTS 5,278,498 A  *  1/1994  Vernon ................ G01N 27/902
                                                       324/234

* cited by examiner

*Primary Examiner* — Henry Choe
(74) *Attorney, Agent, or Firm* — Crestron Electronics, Inc.

(57) ABSTRACT

An inductor is provided, comprising: a first ferrite core piece and a second ferrite core piece, each of which are made of substantially similar materials, exhibit desired electromagnetic properties, and which are fashioned in a substantially similar manner and shape, and wherein each of the first and second ferrite core pieces comprises a substantially planar mating surface, a center post, and a wire core assembly channel, and wherein a first substantially planar mating surface of the first ferrite core piece is adapted to planarly mate with a second substantially planar mating surface of the second ferrite core piece; and a wire core assembly adapted to be substantially self-locating and self-centering about a first or second center post when located in a respective first or second wire core assembly channel.

18 Claims, 15 Drawing Sheets

INDUCTOR APPARATUS OPTIMIZED FOR LOW POWER LOSS IN CLASS-D AUDIO AMPLIFIER APPLICATIONS AND METHOD FOR MAKING THE SAME

CROSS REFERENCE TO RELATED APPLICATIONS

Related subject matter is disclosed in two co-pending U.S. Non-provisional patent applications, with Ser. No. 16/436,390, and Ser. No. 16/436,522, both of which were filed on Jun. 10, 2019, the entire contents of both of which are expressly incorporated herein by reference.

BACKGROUND

Technical Field

Aspects of the embodiments relate generally to inductors used in class D audio amplifiers, and more specifically to systems, method, and modes for an inductor that can be used in a demodulation filter in a class D audio amplifier to minimize certain negative performance parameters, while maximizing other positive performance parameters according to aspects of the embodiments.

Background Art

As those of skill in the art can appreciate, Class-D audio amplifiers use a demodulation filter that in its simplest implementation consists of an inductor-capacitor (L-C) filter in a low-pass arrangement. The purpose of this filter is to attenuate, as much as practically possible, the high-frequency switching waveform generated by the Class-D switching stage, typically in excess of 200 KHz, and leave unchanged, as much as practically possible, the low frequency audio content, typically in the audible range of 20 Hz to 20 KHz. In addition to this basic function, the LC filter has additional, more nuanced effects on the overall performance of the Class-D amplifier, and for that reason, its selection is critical to the performance of the Class-D amplifier. The performance parameters that the Class-D filter, and specifically the inductive component of that filter can effect are: total harmonic distortion (THD), noise and residual modulation, bandwidth and flatness of frequency response, power dissipation and efficiency, step-response, damping factor, feedback loop stability, overcurrent and short-circuit protection response, as well as size and cost.

FIG. 1 illustrates a side view of an inner portion of a first half and second half of a conventional ferrite core (first half, second half) 102a,b, respectively, of conventional inductor 100, without a conventional wire core assembly for use in a conventional LC demodulation filter. Conventional inductor 100 comprises first half 102a, second half 102b, and conventional wire core assembly 200 (shown and described in regard to FIG. 2, below). Each of the first and second halves 102a,b consist of the substantially identical components, so, in fulfillment of the dual purposes of clarity and brevity, only one half will be discussed. First half 102a consists of lead wire channel 104a, wire core channel 106a, center post 108a, and inner surface 110a. Lead wire channel 104a is sized to fit lead wire 202a of conventional wire core assembly 200. Wire core channel 106a is sized and arranged to locate within it wire core body 204 of conventional wire core assembly 200 about substantially circular center post 108a. Substantially planar inner surface 110a of first half 102a is designed to mate with equally substantially planar second inner surface 110b of second half 102b. Both first and second halves 102a,b are substantially equal in all dimensions, so as to create a substantially uniform environment of ferrite material about conventional wire core assembly 200.

FIG. 2 illustrates a side view of an inner surface of first half 102a with conventional wire core assembly 200 for use in a conventional LC demodulation filter. It should be noted that although shown and/or described as "substantially circular," conventional wire core assembly 200 is generally only roughly or approximately circular, and this leads to the inherent problems of conventional inductor 100, as described below.

In assembly (and, as those of skill in the art can appreciate, the order of assembly can change, and therefore this description should not be considered as limiting in any manner whatsoever), either or both of inner surfaces 110a,b are coated with epoxy, and conventional wire core assembly 200 is located about either of center post 108a or center post 108b. Then, first and second halves 102a,b, are pressed together and retained until the epoxy sets. Alternatively, instead of epoxy, tape can be used to keep first and second halves 102a,b together. During assembly, prior to the mating of first and second halves 102a,b, lead wires 202a,b are located within lead wire channel 104a,b, respectively. As can be seen in FIG. 2, following insertion of conventional wire core assembly 200 about center post 108a, first variable spacing 206a and second variable spacing 208a present themselves. First variable spacing 206a exists between inner surface of wire core assembly 214 of conventional wire core assembly 200 and inner wall of wire core channel 210, wherein "inner" refers to a position closer to the center of center post 108. Second variable spacing 208a exists between outer surface of wire core assembly 216 of conventional wire core assembly 200 and outer wall of wire core channel 212 of wire core channel 106. Because of the somewhat inexact manner in which wire core assembly 214 is constructed and inserted, both spacings are variable in distance from a reference point of center post 108

As those of skill in the art can appreciate, the existence of first and second variable spacings 206, 208, which can be respectively referred to as inner variable spacing 206 (because it is located closer or more inwardly to the center of center post 108) and outer variable spacing 208 (because it is located farther away, or more outwardly from the center of center post 108), in conventional inductor 100 is problematic. The inconsistent manner in which conventional wire core assembly 200, and especially wire core body 204 is located within wire core channel 106 means that eddy currents will be created which can cause heating and power loss in conventional wire core assembly 200.

Thus, a need exists for an improved inductor that can be used in a demodulation filter in a class D amplifier to minimize certain negative performance parameters, while maximizing other positive performance parameters according to aspects of the embodiments.

SUMMARY

It is an object of the embodiments to substantially solve at least the problems and/or disadvantages discussed above, and to provide at least one or more of the advantages described below.

It is therefore a general aspect of the embodiments to provide systems, methods, and modes that will obviate or minimize problems of the type previously described by providing an inductor, and method for making that same, wherein the inductor can be used in a demodulation filter in a class D amplifier to minimize certain negative performance parameters, while maximizing other positive performance parameters according to aspects of the embodiments.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

According to a first aspect of the embodiments, an inductor is provided, comprising: first ferrite core piece and a second ferrite core piece, each of which are made of substantially similar materials, exhibit desired electromagnetic properties, and which are fashioned in a substantially similar manner and shape, and wherein each of the first and second ferrite core pieces comprises a substantially planar mating surface, a center post, and a wire core assembly channel, and wherein a first substantially planar mating surface of the first ferrite core piece is adapted to planarly mate with a second substantially planar mating surface of the second ferrite core piece; and a wire core assembly (304) adapted to be substantially self-locating and self-centering about a first or second center post when located in a respective first or second wire core assembly channel.

According to the first aspect of the embodiments, the wire core assembly channel comprises: an inner wall; an outer wall; and a substantially planar channel surface, and wherein the wire core assembly is further adapted to form a substantially uniform wire core space between an inner radial surface of the wire core assembly and the inner wall.

According to the first aspect of the embodiments, wherein each respective center post has a radius, RCP, the center post located in the substantially planar channel surface, and having a substantially planar center post upper surface that is located between the substantially planar channel surface and the substantially planar mating surface.

According to the first aspect of the embodiments, wherein the outer wall rises from the substantially planar channel surface to the substantially planar mating surface, and wherein the inner wall rises from the substantially planar channel surface to the substantially planar center post upper surface thereby forming the center post.

According to the first aspect of the embodiments, about fifty percent of the outer wall is substantially circular with a radius RCH about the center of the center post.

According to the first aspect of the embodiments, the wire core assembly, when located in the channel, is adapted to form the substantially uniform core space that is a maximum and substantially constant distance between the inner radial surface of the wire core assembly and the inner wall.

According to the first aspect of the embodiments, the wire core assembly comprises: a substantially cylindrical arrangement of a length of flat magnet wire, wound in a single layer, spiral manner, with a substantially constant inner and outer radius, such that a substantial majority of the wire core assembly is of substantially uniform appearance and exhibits substantially uniform magnetic characteristics; and a first lead portion and a second lead portion, the first and second lead portions located at a first end and second end of the length of flat magnet wire respectively, the lead portions adapted to be connected to external circuitry.

According to the first aspect of the embodiments, the wire core assembly comprises: spring like characteristics such that when the first and second leads are pushed towards each other to a first separation distance, the outer radius of the wire core assembly reduces enough such that the wire core assembly can be located within the wire core assembly channel.

According to the first aspect of the embodiments, the outer radius of the uncompressed wire core assembly, RWCA-O-U, is larger than the radius of the wire core assembly channel, RCH, such that when the first and second leads are allowed to return to their uncompressed state, the wire core assembly expands to fit substantially immovably against the outer wall.

According to the first aspect of the embodiments, the substantially uniform magnetic characteristics includes one or more of low shunt capacitance and interwinding capacitance.

According to the first aspect of the embodiments, the inductor further comprises: a base plate adapted to provide through-holes for the first and second lead portions.

According to the first aspect of the embodiments, the base plate is made of a substantially similar ferrite material as the first and second core pieces.

According to the first aspect of the embodiments, the inductor is adapted to be used in a low pass audio frequency filter.

According to the first aspect of the embodiments, the low pass audio frequency filter is an inductor-capacitor filter.

According to the first aspect of the embodiments, the inductor is adapted to be used in an audio amplifier.

According to the first aspect of the embodiments, the inductor is adapted to be used in a low pass audio frequency filter (LPF), and wherein the LPF is adapted to remove high frequency constant switching frequency components, and wherein the switching frequency is about 400 KHz.

According to the first aspect of the embodiments, the ferrite core pieces are fabricated from a first ferrite material composition selected for low hysteresis loss when the inductor is operating at the switching frequency of about 400 kHz.

According to the first aspect of the embodiments, the inductor is adapted to be used in a low pass audio frequency filter (LPF), and wherein the LPF is adapted to remove high frequency variable switching frequency components, and wherein the variable switching frequency ranges from about 100 kHz to about 800 kHz.

According to the first aspect of the embodiments, the ferrite core pieces are fabricated from a second ferrite material composition selected for low hysteresis loss when the inductor is operating at the variable switching frequency that ranges from about 100 kHz to about 800 kHz.

According to a second aspect of the embodiments, an audio amplifier is provided, comprising: circuitry adapted to receive an audio signal, amplify the same, and output the amplified audio signal, the circuitry comprising at least one inductor, the inductor comprising—first ferrite core piece and a second ferrite core piece, each of which are made of substantially similar materials, exhibit desired electromagnetic properties, and which are fashioned in a substantially similar manner and shape, and wherein each of the first and second ferrite core pieces comprises a substantially planar mating surface, a center post, and a wire core assembly channel, and wherein a first substantially planar mating surface of the first ferrite core piece is adapted to planarly mate with a second substantially planar mating surface of the second ferrite core piece; and a wire core assembly adapted to be substantially self-locating and self-centering about a first or second center post when located in a respective first or second wire core assembly channel.

According to the second aspect of the embodiments, the wire core assembly channel comprises: an inner wall; an outer wall; and a substantially planar channel surface, and wherein the wire core assembly is further adapted to form a substantially uniform wire core space between an inner radial surface of the wire core assembly and the inner wall.

According to the second aspect of the embodiments, each respective center post has a radius, RCP, the center post located in the substantially planar channel surface, and having a substantially planar center post upper surface that is located between the substantially planar channel surface and the substantially planar mating surface.

According to the second aspect of the embodiments, the outer wall rises from the substantially planar channel surface to the substantially planar mating surface, and wherein the inner wall rises from the substantially planar channel surface to the substantially planar center post upper surface thereby forming the center post.

According to the second aspect of the embodiments, about fifty percent of the outer wall is substantially circular with a radius RCH about the center of the center post.

According to the second aspect of the embodiments, the wire core assembly, when located in the channel, is adapted to form the substantially uniform core space that is a maximum and substantially constant distance between the inner radial surface of the wire core assembly and the inner wall.

According to the second aspect of the embodiments, the wire core assembly comprises: a substantially cylindrical arrangement of a length of flat magnet wire, wound in a single layer, spiral manner, with a substantially constant inner and outer radius, such that a substantial majority of the wire core assembly is of substantially uniform appearance and exhibits substantially uniform magnetic characteristics; and a first lead portion and a second lead portion, the first and second lead portions located at a first end and second end of the length of flat magnet wire respectively, the lead portions adapted to be connected to external circuitry.

According to the second aspect of the embodiments, the wire core assembly comprises: spring like characteristics such that when the first and second leads are pushed towards each other to a first separation distance, the outer radius of the wire core assembly reduces enough such that the wire core assembly can be located within the wire core assembly channel.

According to the second aspect of the embodiments, the outer radius of the uncompressed wire core assembly, RWCA-O-U, is larger than the radius of the wire core assembly channel, RCH, such that when the first and second leads are allowed to return to their uncompressed state, the wire core assembly expands to fit substantially immovably against the outer wall.

According to the second aspect of the embodiments, the substantially uniform magnetic characteristics includes one or more of low shunt capacitance and interwinding capacitance.

According to the second aspect of the embodiments, the audio amplifier further comprises a base plate adapted to provide through-holes for the first and second lead portions.

According to the second aspect of the embodiments, the base plate is made of a substantially similar ferrite material as the first and second core pieces.

According to the second aspect of the embodiments, the inductor is adapted to be used in a low pass audio frequency filter.

According to the second aspect of the embodiments, the low pass audio frequency filter is an inductor-capacitor filter.

According to the second aspect of the embodiments, the inductor is adapted to be used in a low pass audio frequency filter (LPF), and wherein the LPF is adapted to remove high frequency constant switching frequency components, and wherein the switching frequency is about 400 KHz.

According to the second aspect of the embodiments, the ferrite core pieces are fabricated from a first ferrite material composition selected for low hysteresis loss when the inductor is operating at the switching frequency of about 400 kHz.

According to the second aspect of the embodiments, the inductor is adapted to be used in a low pass audio frequency filter (LPF), and wherein the LPF is adapted to remove high frequency variable switching frequency components, and wherein the variable switching frequency ranges from about 100 kHz to about 800 kHz.

According to the second aspect of the embodiments, the ferrite core pieces are fabricated from a second ferrite material composition selected for low hysteresis loss when the inductor is operating at the variable switching frequency that ranges from about 100 kHz to about 800 kHz.

According to a third aspect of the embodiments, a method for assembling an inductor for use in an Class D amplifier is provided, the method comprising: obtaining first and second ferrite core pieces, wherein each of the first and second ferrite core pieces are made of substantially similar materials, exhibit substantially similar desired electromagnetic properties, and which are fashioned in a substantially similar manner and shape, and wherein each of the first and second ferrite core pieces comprises a substantially planar mating surface, a center post, and a wire core assembly channel (404), wherein the wire core assembly channel surrounds the center post, and comprises an inner wall that is also a center post radial outer wall; an outer wall; and a substantially planar channel surface, and wherein a first substantially planar mating surface of the first ferrite core piece is adapted to planarly mate with a second substantially planar mating surface of the second ferrite core piece; obtaining a wire core assembly (WCA), the WCA adapted to be compressible from a first outer radius to a second outer radius, and the WCA comprising a WCA substantially cylindrical outer radial surface and a WCA substantially cylindrical inner radial surface; compressing the WCA from the first outer radius to the second outer radius, wherein the second outer radius is less than a WCA channel outer wall radius, and the first outer radius is greater than the WCA channel outer wall radius; inserting the compressed WCA into the channel about the center post of either the first or second ferrite core piece; and releasing the compression of the compressed WCA, such that the substantially cylindrical outer radial surface of the WCA is forced against that portion of the channel outer wall that is substantially circular.

According to the third aspect of the embodiments, 1, following the steps of insertion and releasing, the WCA substantially cylindrical outer radial surface is located at a maximum, substantially constant distance from the center post radial outer wall.

According to the third aspect of the embodiments, following the steps of insertion and releasing, a substantially uniform cylindrical gap is formed between the center post radial outer wall and the WCA substantially cylindrical inner radial surface.

According to the third aspect of the embodiments, the method further comprises: joining the remaining ferrite core piece with the ferrite core piece containing the WCA.

According to the third aspect of the embodiments, the wire core assembly is adapted to be substantially self-locating and self-centering about the center post when located in the WCA channel.

According to the third aspect of the embodiments, the step of obtaining the WCA comprises: forming the wire core assembly (WCA) from flat magnet wire in a spring-like manner such that the flat magnet wire is bent in a spiral fashion, and exhibits spring-like characteristics.

According to the third aspect of the embodiments, the step of forming the WCA comprises: spiraling a suitable length of flat magnet wire into a plurality of spirals, the flat magnet wire comprising a first pair of substantially parallel surfaces, and a second pair of substantially parallel surfaces, each of which are substantially orthogonal to the first pair of surfaces, and wherein a first length dimension of each of the first pair of substantially parallel surfaces is substantially smaller than a second length dimension of each of the second pair of substantially parallel surfaces, and wherein the spiraling of the flat magnet wires occurs such that the spiral is formed in a single layer manner, such that the second pair of substantially parallel surfaces of successive spirals of flat magnet wire are located substantially parallel and adjacent to each other, and wherein the WCA substantially cylindrical outer radial surface and the WCA substantially cylindrical inner radial surface are formed by the plurality of the first pairs of substantially parallel surfaces.

According to the third aspect of the embodiments, the step of spiraling comprises: forming a main winding portion of the wire core assembly; and forming first and second leads, respectively, at a first end of the spiral and at a second end of the spiral.

According to the third aspect of the embodiments, the wire core assembly comprises: a substantially cylindrical arrangement of a length of flat magnet wire, wound in a spiral manner, with a substantially constant inner and outer radius, such that a substantial majority of the wire core assembly is of substantially uniform appearance and exhibits substantially uniform magnetic characteristics; and a first lead portion and a second lead portion, the first and second lead portions located at a first end and second end of the length of flat magnet wire respectively, the lead portions adapted to be connected to external circuitry.

According to the third aspect of the embodiments, the step of compressing the wire core assembly comprises: pushing the first and second lead portion towards each other to a first separation distance wherein the outer radius of the wire core assembly reduces from the first outer radius to the second outer radius such that the wire core assembly can be located within the WCA channel.

According to the third aspect of the embodiments, the first outer radius of the uncompressed wire core assembly is larger than the WCA channel outer wall radius, such that when the first and second leads are allowed to return to their uncompressed state, the wire core assembly expands to fit snugly against the outer wall of the WCA channel.

According to the third aspect of the embodiments, the substantially uniform magnetic characteristics includes one or more of low shunt capacitance and interwinding capacitance.

According to the third aspect of the embodiments, the inductor further comprises a base plate adapted to provide through-holes for the first and second lead portions.

According to the third aspect of the embodiments, the base plate is made of a substantially similar ferrite material as the first and second core pieces.

According to the third aspect of the embodiments, the inductor is adapted to be used in a low pass audio frequency filter.

According to the third aspect of the embodiments, the low pass audio frequency filter is an inductor-capacitor filter.

According to the third aspect of the embodiments, the inductor is adapted to be used in an audio amplifier.

According to the third aspect of the embodiments, the inductor is adapted to be used in a low pass audio frequency filter (LPF), and wherein the LPF is adapted to remove high frequency constant switching frequency components, and wherein the switching frequency is about 400 KHz.

According to the third aspect of the embodiments, the ferrite core pieces are fabricated from a first ferrite material composition selected for low hysteresis loss when the inductor is operating at the switching frequency of about 400 kHz.

According to the third aspect of the embodiments, the inductor is adapted to be used in a low pass audio frequency filter (LPF), and wherein the LPF is adapted to remove high frequency variable switching frequency components, and wherein the variable switching frequency ranges from about 100 kHz to about 800 kHz.

According to the third aspect of the embodiments, the ferrite core pieces are fabricated from a second ferrite material composition selected for low hysteresis loss when the inductor is operating at the variable switching frequency that ranges from about 100 kHz to about 800 kHz.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

BRIEF DESCRIPTION OF THE SEVERAL VIEWS OF THE DRAWING

Figure 1:
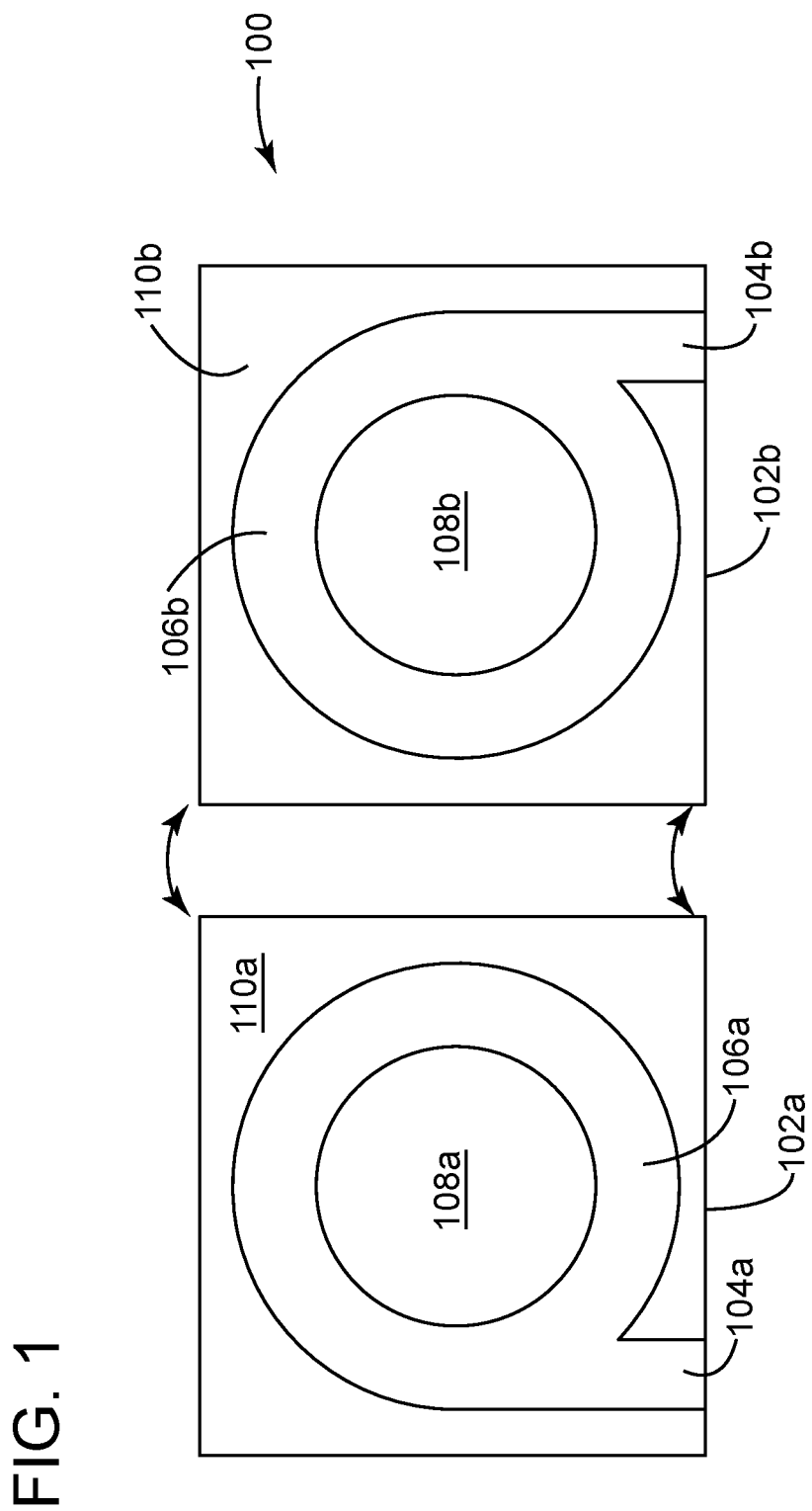

FIG. 1 illustrates a planar view of a mating surface of two halves of a conventional ferrite core of an inductor without a conventional wire core assembly for use in a conventional inductor-capacitor (LC) demodulation filter.

Figure 2:
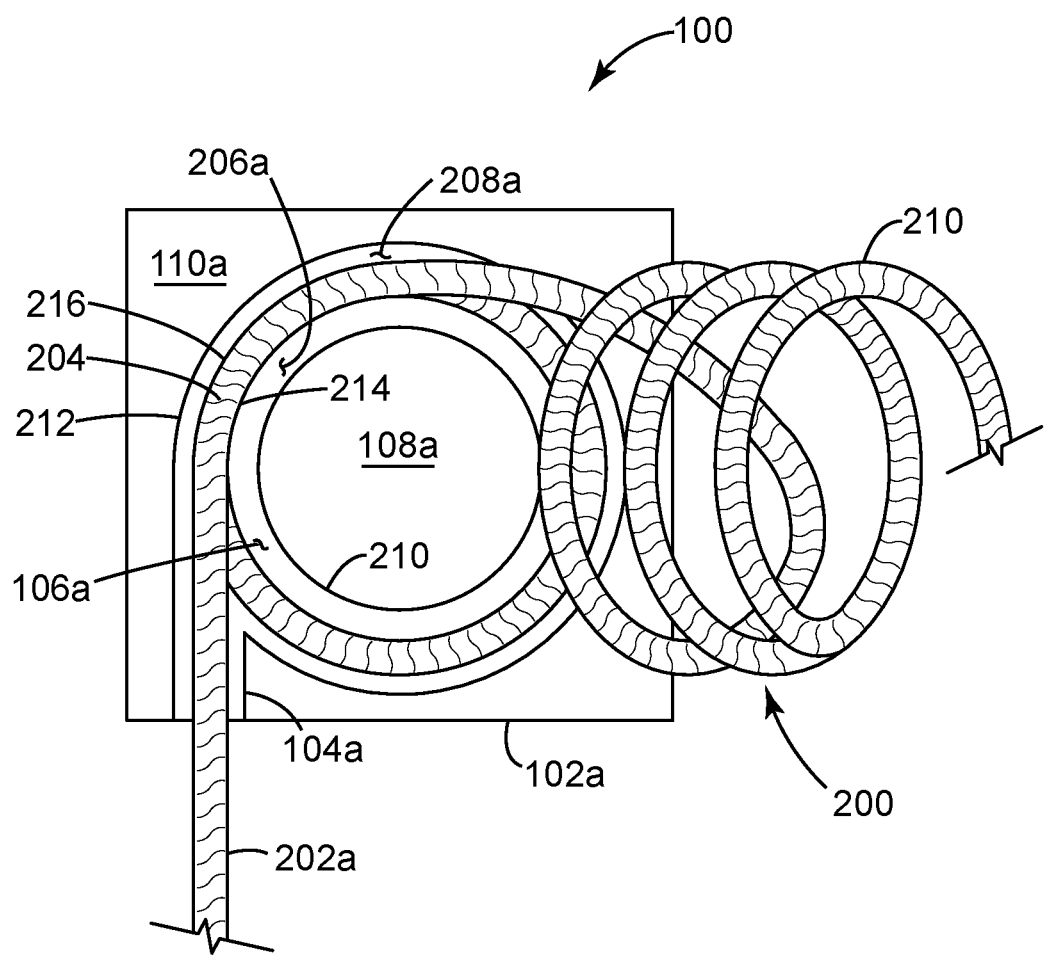

FIG. 2 illustrates a planar view of a mating surface of a first half of the conventional ferrite core of FIG. 1, with a conventional wire core assembly for use in a conventional LC demodulation filter.

Figure 3:
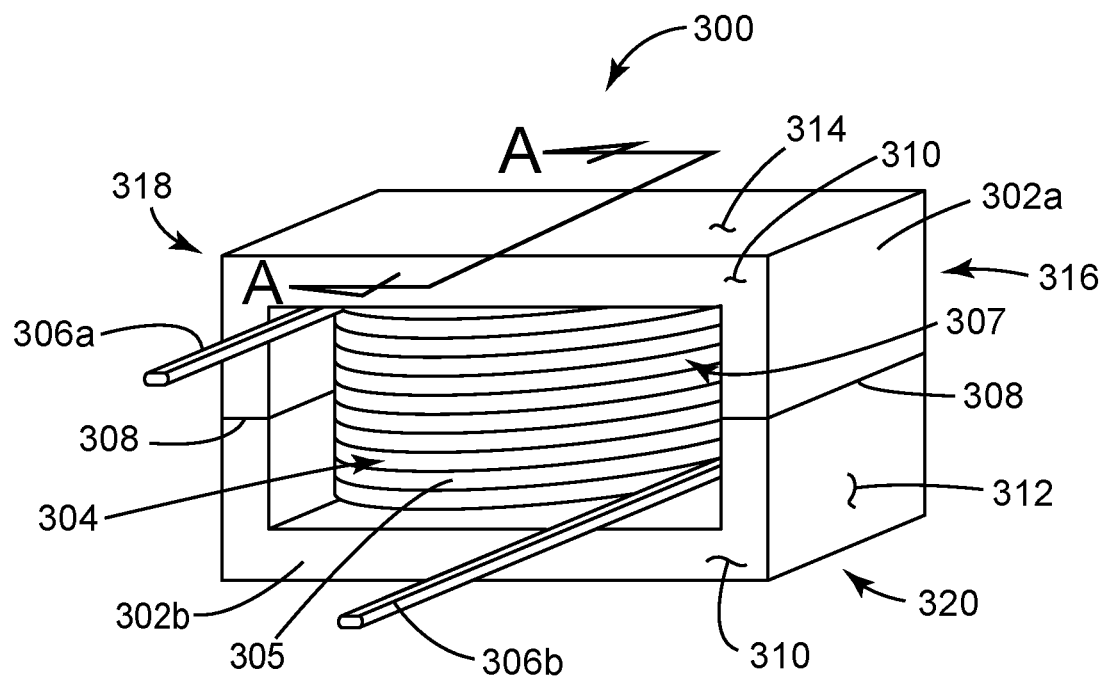

FIG. 3 illustrates a bottom perspective view of a ferrite core inductor assembly (inductor) for use in an LC demodulation filter according to aspects of the embodiments.

Figure 4:
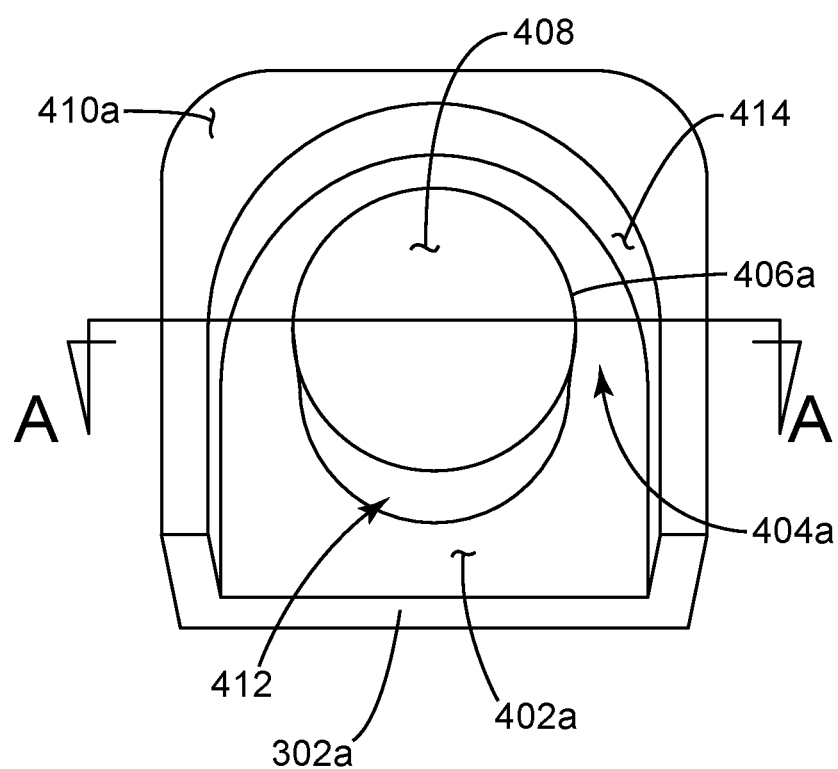

FIG. 4 illustrates a perspective view of a mating surface of a first ferrite core piece for use in an inductor to be used in an LC demodulation filter according to aspects of the embodiments.

Figure 5:
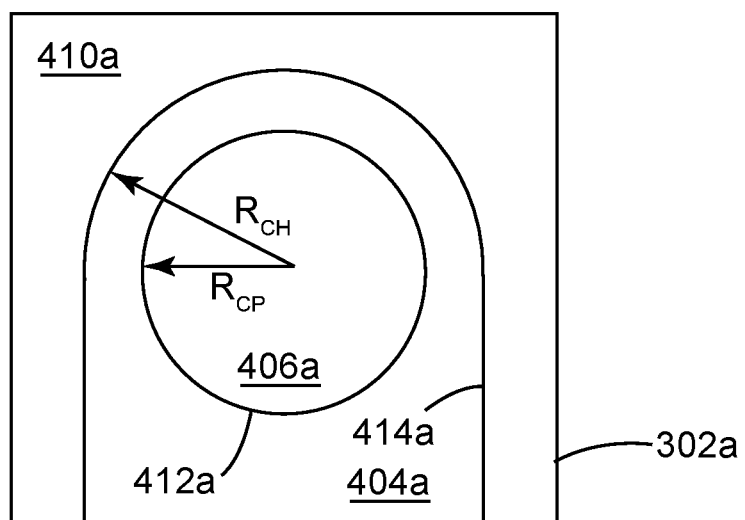

FIG. 5 illustrates a planar view of the mating surface of the first ferrite core piece shown in FIG. 4 according to aspects of the embodiments.

Figure 6:
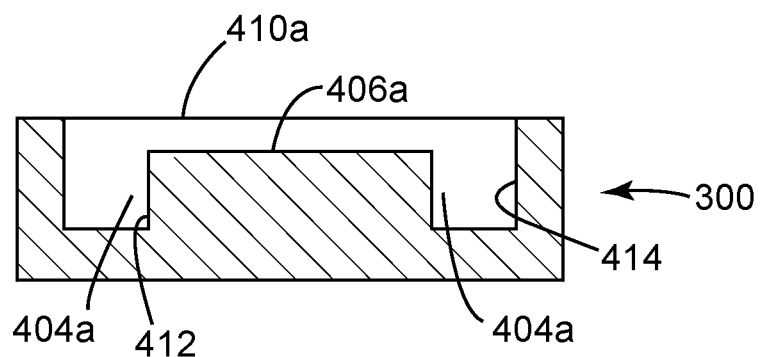

FIG. 6 illustrates a sectional view along line A-A of FIG. 4 of the first ferrite core piece according to aspects of the embodiments.

Figure 7:
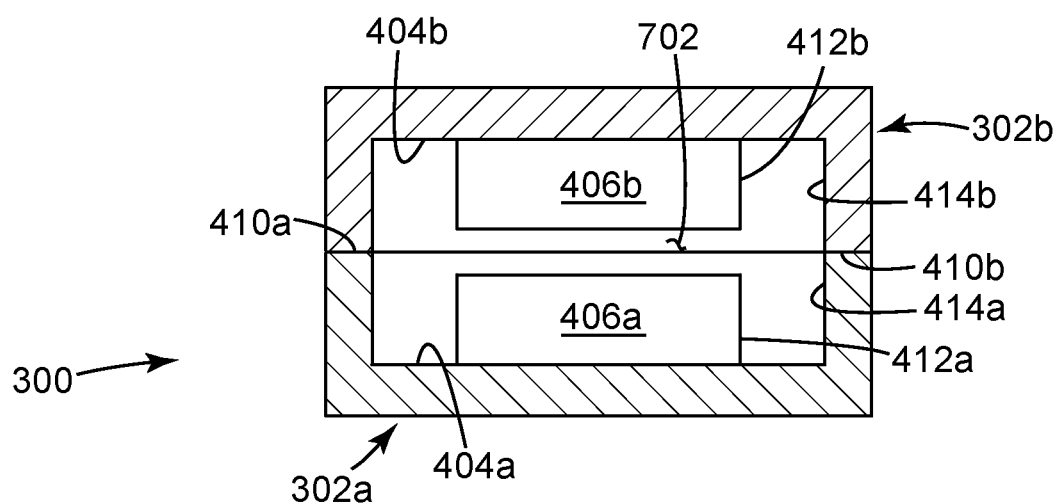

FIG. 7 illustrates a bottom view of mated first and second ferrite core pieces of ferrite core inductor assembly without an inserted flat magnet wire core assembly according to aspects of the embodiments.

Figure 8:
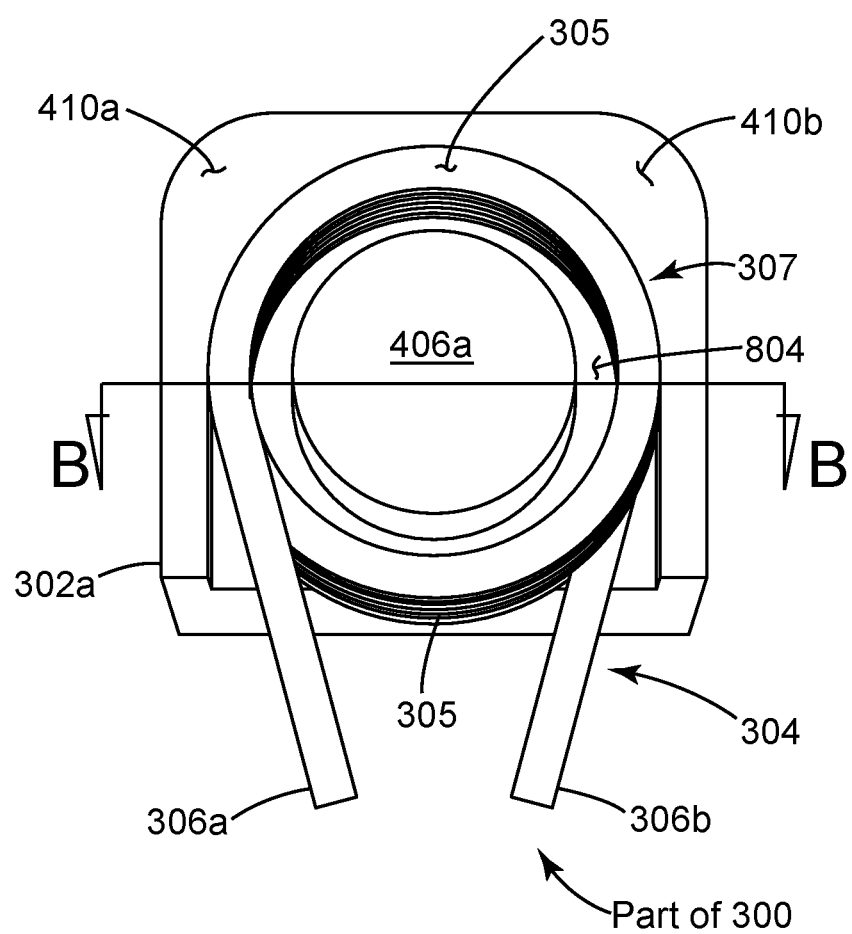

FIG. 8 illustrates a perspective view of a mating surface of the first ferrite core piece as shown in FIG. 4 with a flat magnet wire core assembly inserted thereto for use as an inductor in an LC demodulation filter according to aspects of the embodiments.

Figure 9:
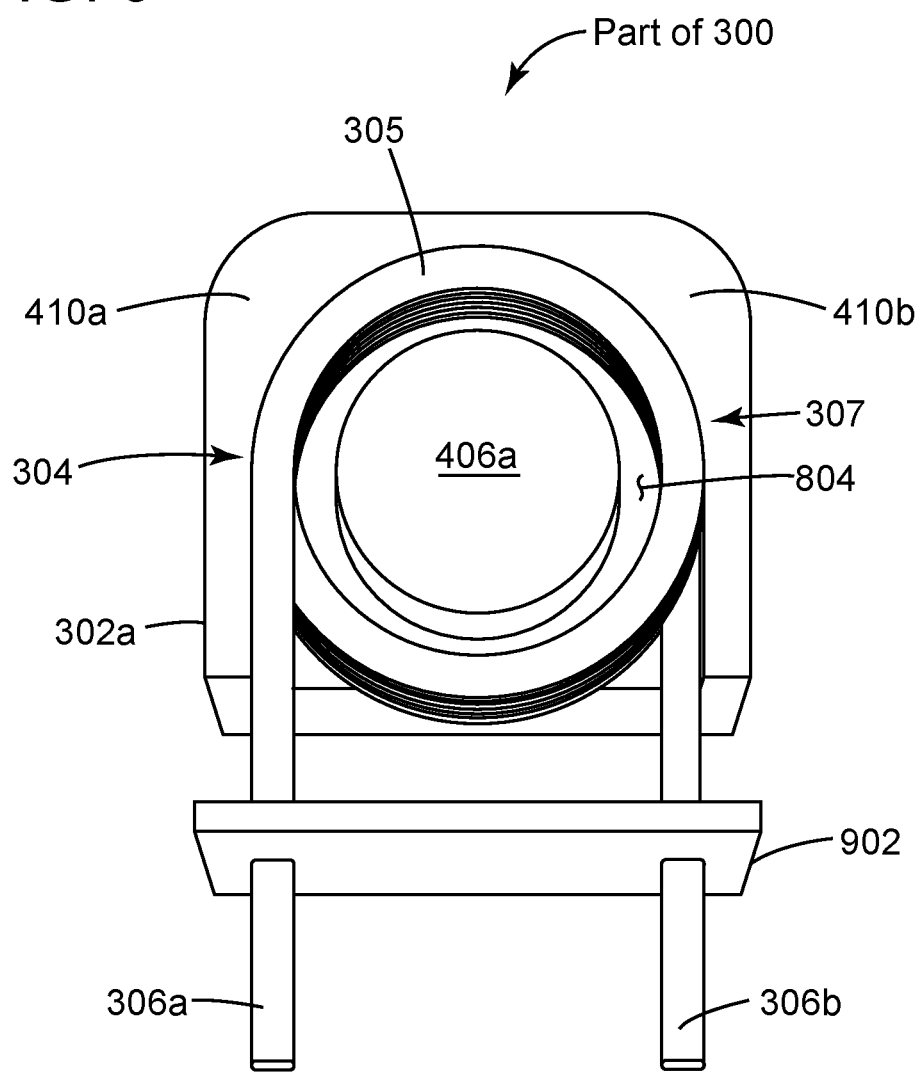

FIG. 9 illustrates a perspective view of a mating surface of the first ferrite core piece with the flat magnet wire core assembly inserted thereto for use as an inductor in an LC demodulation filter and a base plate according to aspects of the embodiments.

Figure 10:
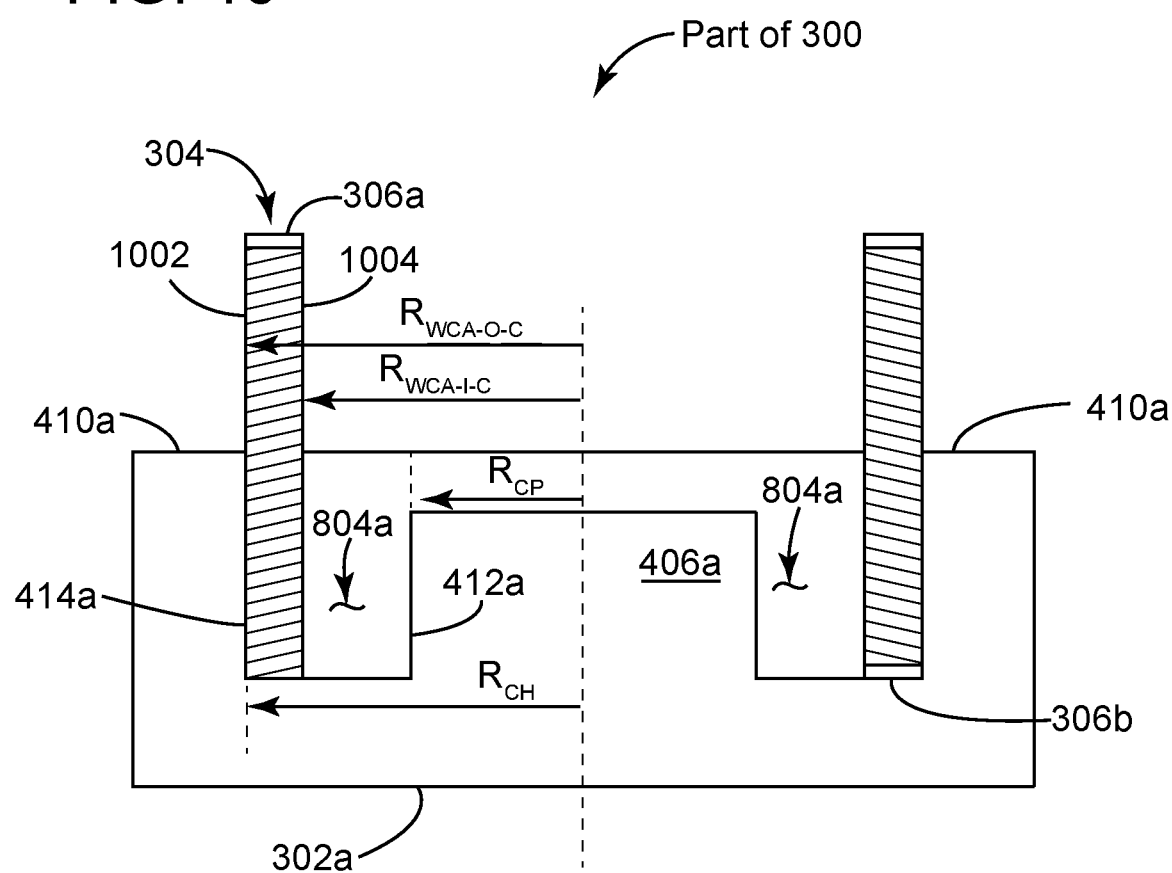

FIG. 10 illustrates a sectional view along line B-B of FIG. 8 of the first ferrite core piece as shown in FIG. 4 with a flat magnet wire core assembly for use as an inductor in an LC demodulation filter according to aspects of the embodiments.

Figure 11A:
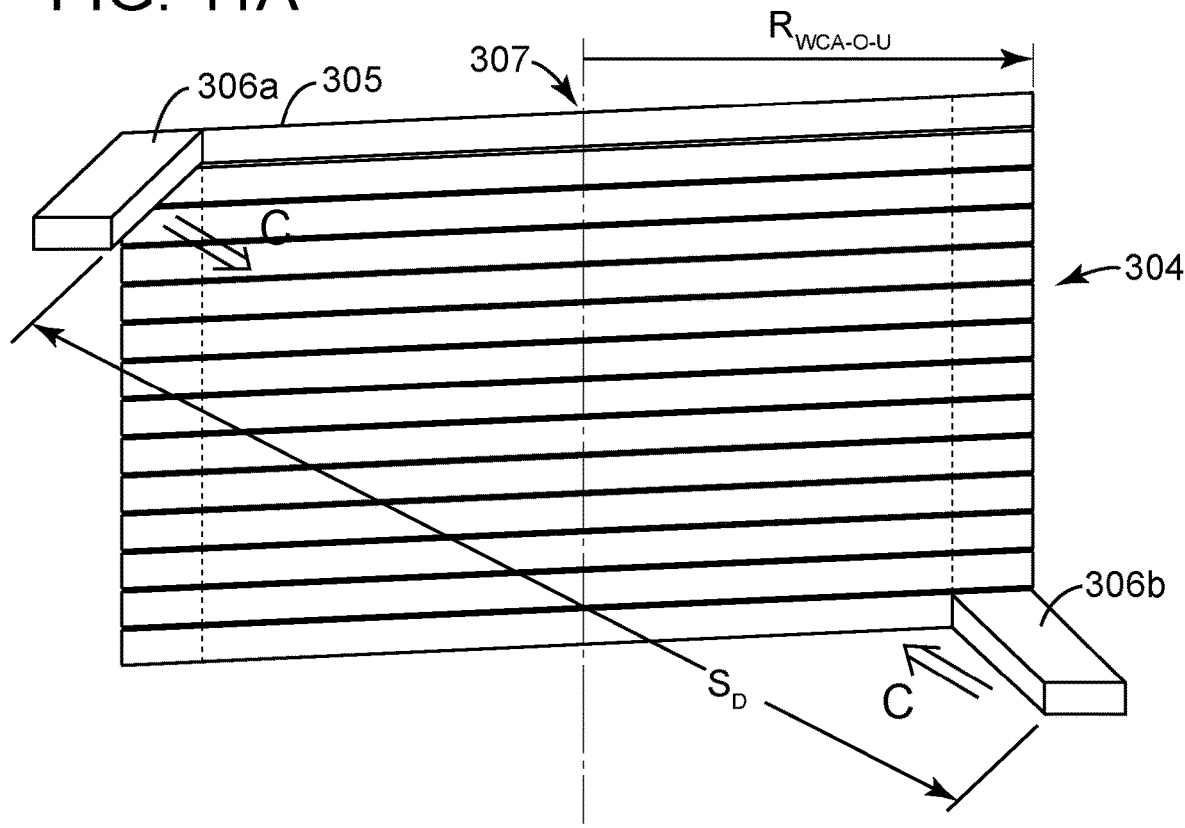
Figure 11B:
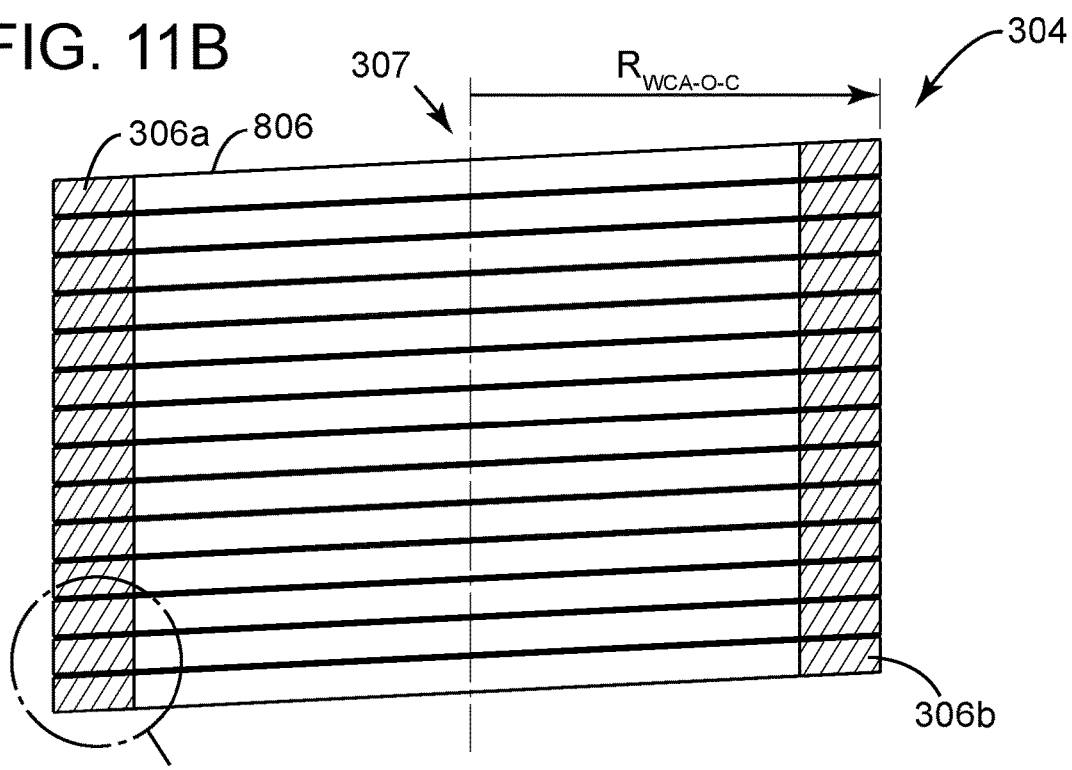

FIG. 11A illustrates a cross sectional view of the wire core assembly when un-compressed, and FIG. 11B illustrates a cross sectional view of the wire core assembly when compressed, according to aspects of the embodiments.

Figure 12:
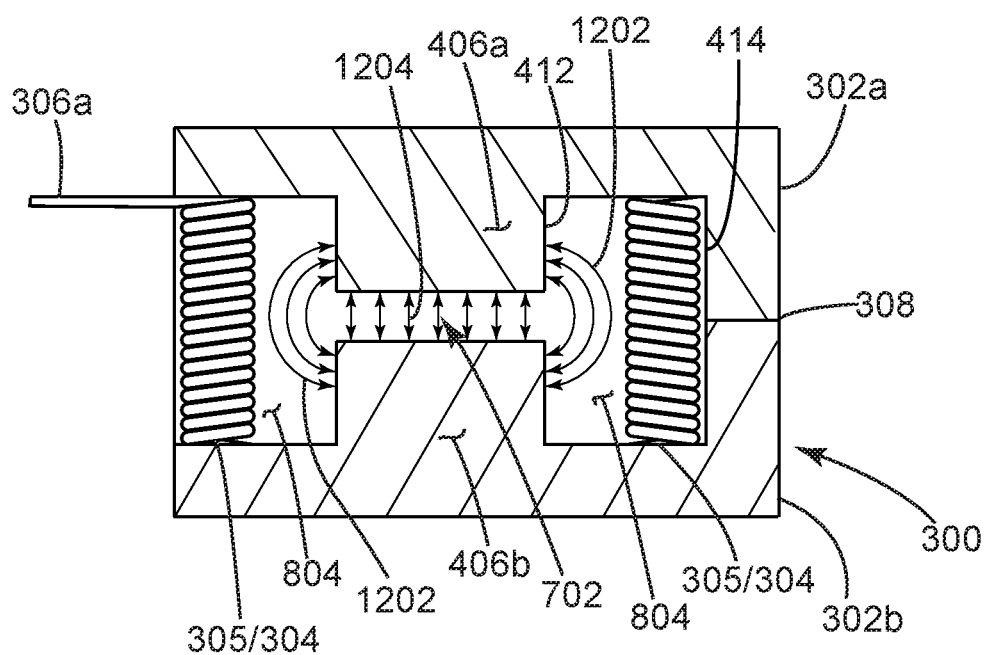

FIG. 12 illustrates a cross sectional view of an inductor along lines A-A of FIG. 3 according to aspects of the embodiments.

Figure 13:
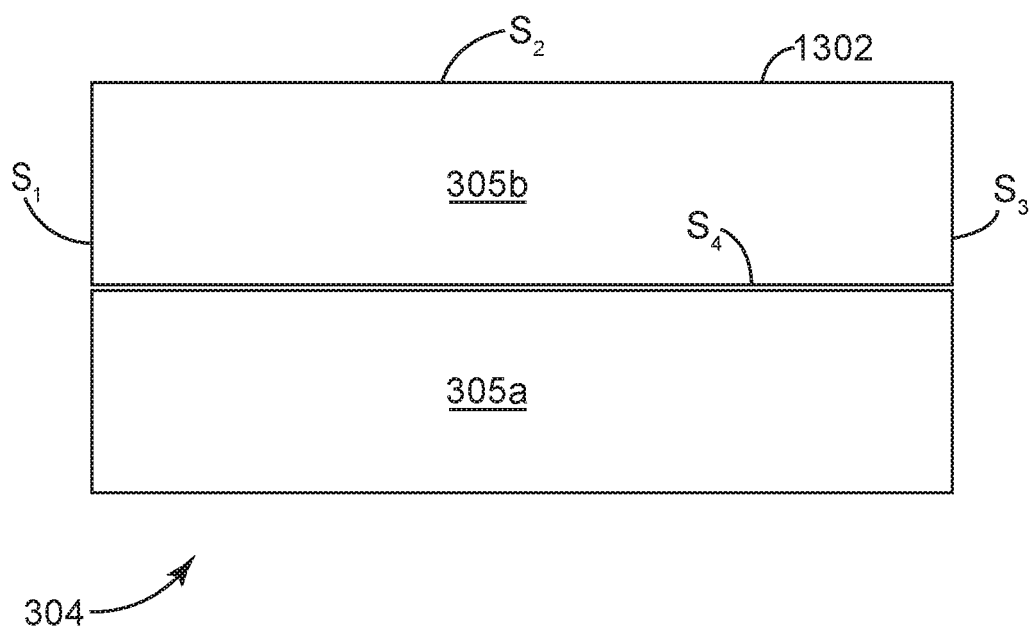

FIG. 13 illustrates a close up view of Area A shown in FIG. 11B of two layers of a wire core assembly according to aspects of the embodiments.

Figure 14:
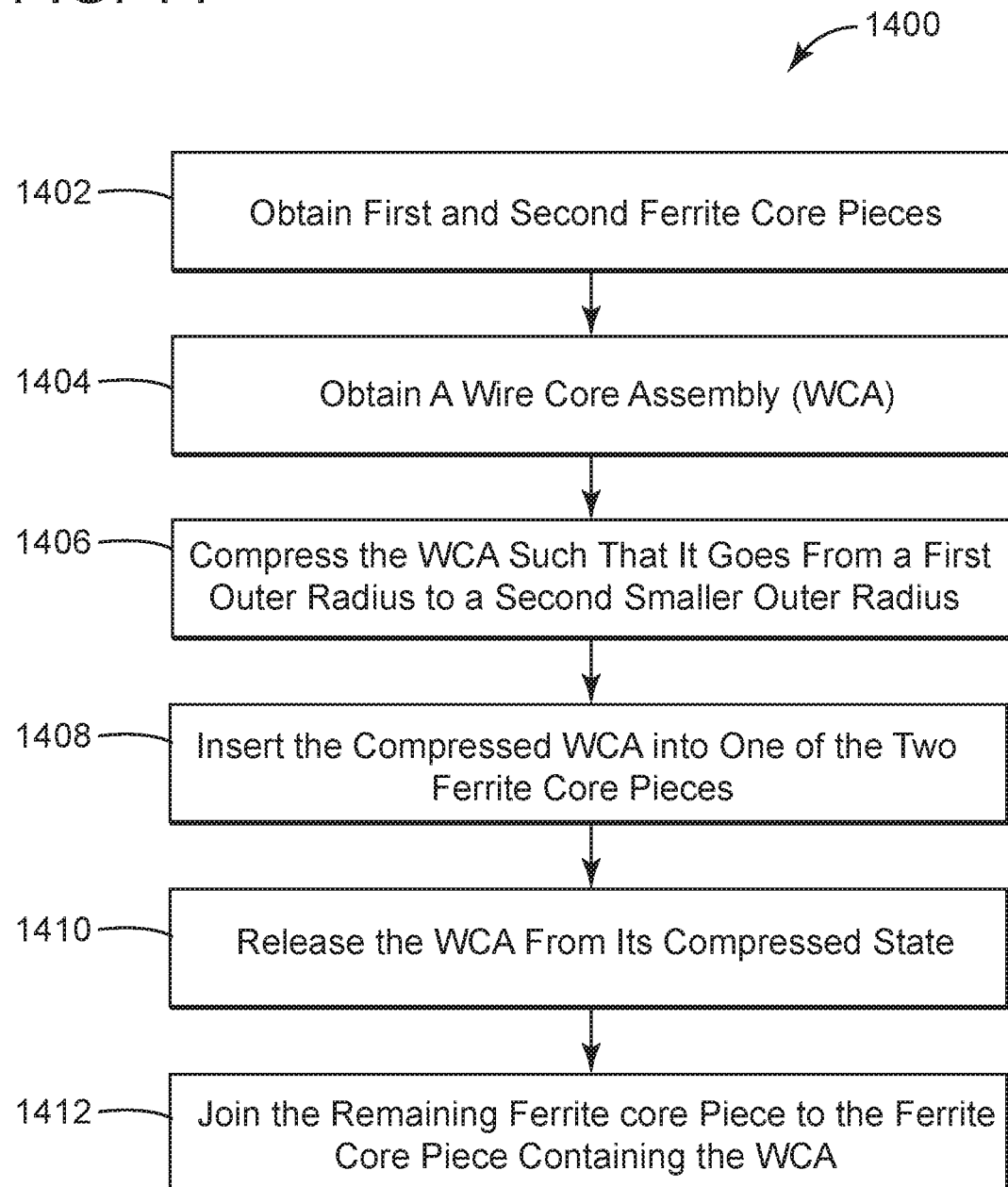

FIG. 14 illustrates a flow diagram of a method for assembling an inductor according to aspects of the embodiments.

Figure 15:
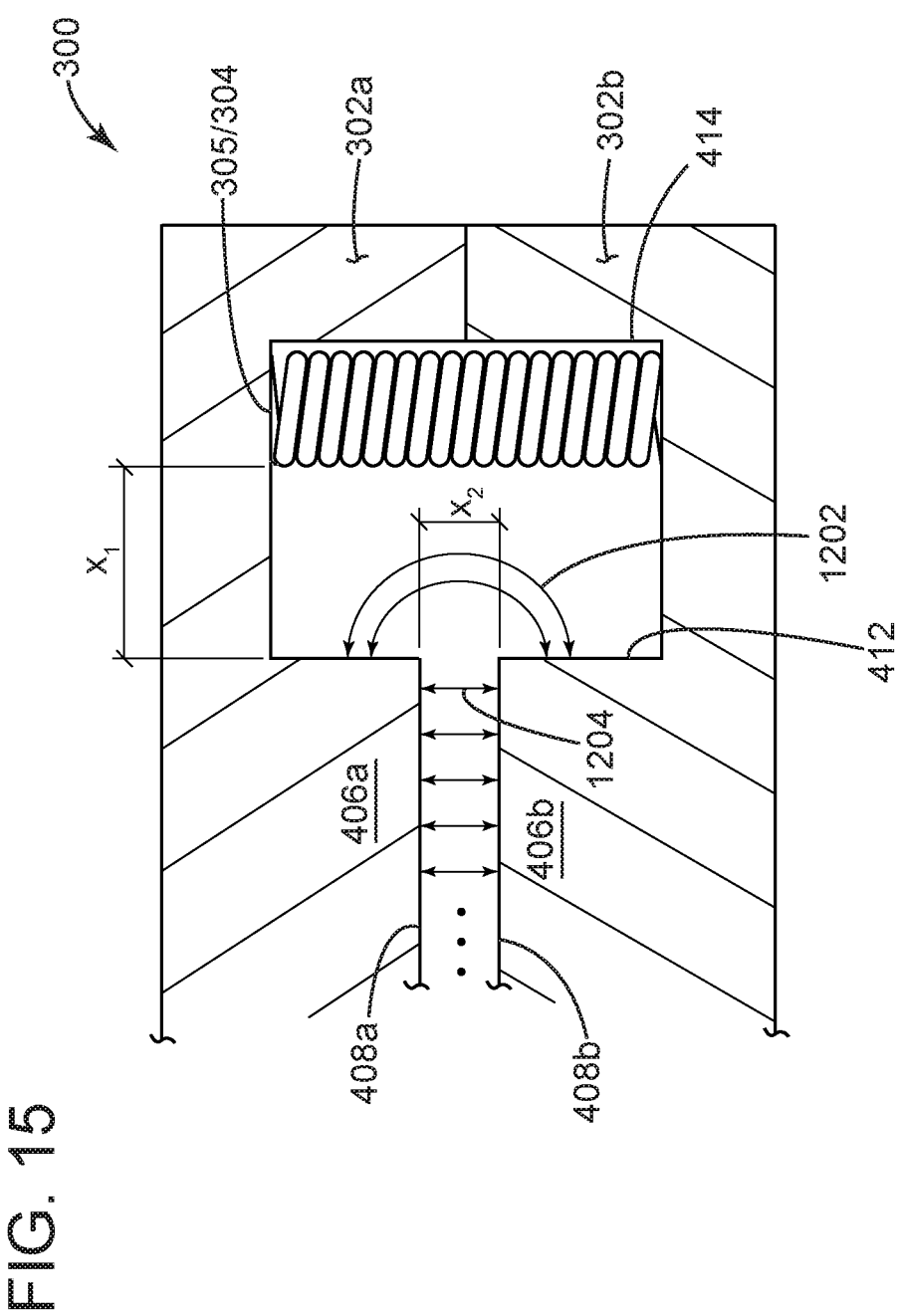

FIG. 15 illustrates an expanded cross sectional view of a portion of an inductor along lines A-A of FIG. 3 according to aspects of the embodiments.

DETAILED DESCRIPTION

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of an audio equipment company, so it is to be understood that generally the concepts discussed herein are applicable to various subsystems and not limited to only a particular audio device or class of devices, such as audio amplifiers and filters.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" or "in an embodiment" in various places throughout the specification is not necessarily referring to the same embodiment. Further, the particular feature, structures, or characteristics may be combined in any suitable manner in one or more embodiments.

LIST OF REFERENCE NUMBERS FOR THE ELEMENTS IN THE DRAWINGS IN NUMERICAL ORDER

The following is a list of the major elements in the drawings in numerical order.
100 Conventional Inductor
102a First Half of Ferrite Core (First Half)
102b Second Half of Ferrite Core (Second Half)
104 Lead Wire Channel
106 Wire Core Channel
108 Center Post
110 Inner Surface
200 Conventional Wire Core Assembly
202 Lead Wire
204 Wire Core Body
206 First Variable Spacing (Inner Variable Spacing)
208 Second Variable Spacing (Outer Variable Spacing)
210 Inner Wall of Wire Core Channel
212 Outer Wall of Wire Core Channel
214 Inner Surface of Wire Core Assembly
216 Outer Surface of Wire Core Assembly
300 Ferrite Core Inductor Assembly (Inductor)
302a First Ferrite Core Piece
302b Second Ferrite Core Piece
304 Flat Magnet Wire Core Assembly (Wire Core Assembly (WCA))
305 Flat Magnet Wire
306 Lead Wire
307 Main Winding Area
308 Epoxy
310 Bottom Side
312 Right Side
314 Front Side
316 Top Side
318 Left Side
320 Rear Side
402 Substantially Planar Channel Surface
404 Wire Core Assembly (WCA) Channel
406 Center Post
408 Substantially Planar Center Post Surface
410 Substantially Planar Mating Surface
412 Inner Wall of Wire Core Assembly Channel
414 Outer Wall of Wire Core Assembly Channel
702 Center Post Gap
804 Substantially Uniform Wire Core Space (Wire Core Space)
902 Base Plate
1002 Outer Radial Surface of Wire Core Assembly
1004 Inner Radial Surface of Wire Core Assembly
1202 Fringing Flux
1204 Center Flux
1302 Insulation
1400 Method for Assembling Inductor 300
1402-1412 Steps of Method 1400

LIST OF ACRONYMS USED IN THE SPECIFICATION IN ALPHABETICAL ORDER

The following is a list of the acronyms used in the specification in alphabetical order.
EMI Electro Magnetic Interference
LC Inductor Capacitor
PCB Printed Circuit Board RCH Channel Radius
RCP Center Post Radius
RWCA-I-C Wire Core Assembly Inner Radius-Compressed
RWCA-O-C Wire Core Assembly Outer Radius-Compressed
RWCA-O-U Wire Core Assembly Outer Radius-Un-Compressed
THD Total Harmonic Distortion
WCA Wire Core Assembly The different aspects of the embodiments described herein pertain to the context of a home, office, or enterprise location control network, but is not limited thereto, except as may be set forth expressly in the appended claims.

For over 40 years Crestron Electronics Inc., of Rockleigh, N.J., has been the world's leading manufacturer of advanced control and automation systems, innovating technology to simplify and enhance modern lifestyles and businesses. Crestron designs, manufactures, and offers for sale integrated solutions to control audio, video, computer, and environmental systems. In addition, the devices and systems offered by Crestron streamline technology, improving the quality of life in commercial buildings, universities, hotels, hospitals, and homes, among other locations. Accordingly, the systems, methods, and modes of the aspects of the embodiments described herein, as embodied as ferrite core inductor assembly 300 and flat magnet wire core assembly 304, and its constituent components, can be manufactured by Crestron Electronics, Inc., located in Rockleigh, N.J.

FIG. 3 illustrates a bottom perspective view of ferrite core inductor assembly (inductor) 300 for use in an LC demodulation filter according to aspects of the embodiments. Inductor 300 comprises a bottom side 310, right side 312, front side 314, top side 316, left side 318, and rear side 320 according to aspects of the embodiments.

Inductor 300 comprises first ferrite core piece 302a, second ferrite core piece 302b, flat magnet wire core assembly (WCA) 304, and, optionally, epoxy 308 according to aspects of the embodiments. WCA 304 comprises flat magnet wire 305, main winding area 307, and lead wires 306a,b according to aspects of the embodiments. First and second ferrite core pieces 302a,b are substantially similar to each other in terms of dimensions and composition, and are designed to be substantial mirror images of the other, as the two are joined and mated together, with the wound WCA 304, discussed below, in between the two halves, and are typically epoxied together, although other joining means can be used, such as tape, other types of glue, among other means. Referring, therefore, in fulfillment of the dual purposes of clarity and brevity, to only first ferrite core piece 302a, attention is directed to FIG. 4.

FIG. 4 illustrates a perspective view of a mating surface of a first ferrite core piece 302a for use in an inductor 300 to be used in an LC demodulation filter according to aspects of the embodiments. As shown in FIG. 4, first ferrite core piece 302a comprises center post 406a, substantially planar mating surface 410a, wire core and assembly (WCA) channel 404a. Center post 406a comprises substantially planar center post surface 408a. WCA channel 404a comprises inner wall of WCA channel 412, and outer wall of WCA channel 414 according to aspects of the embodiments; as those of skill in the art can appreciate, inner wall 412 is also part of center post 406.

The uppermost portion of first ferrite core piece 302a can be referred to as substantially planar mating surface 410a, which mates with a substantially similarly constructed mating surface 410b of second ferrite core piece 302b, not shown in FIG. 4. Center post 406 rises substantially perpendicularly from substantially planar channel surface 402 with a substantially constant radius and an upper surface referred to as substantially planar center post surface 408. Each of channel surface 402a, center post surface 408a, and mating surface 410a are substantially parallel to each other, but not co-planar; second ferrite core 302b comprises substantially identical surfaces with substantially identical planar and parallel characteristics. WCA channel 404a is formed by channel surface 402a, inner wall 412a, and outer wall 414a. Located substantially centrally within first ferrite core piece 302a is center post 406a, about which can be located WCA 304 (shown in FIGS. 8, 9, 10, 11A, 11B, 12 and 15) within WCA channel 404a when assembled. As those of skill in the art can appreciate, both first and second ferrite core pieces 302a,b are generally molded and then milled of an appropriate ferrite material, which is described in greater detail below.

FIG. 5 illustrates a planar view of the mating surface of the first ferrite core piece shown in FIG. 4 according to aspects of the embodiments. According to aspects of the embodiments, second ferrite core piece 302b is substantially identical to first ferrite core piece 302a in terms of dimensions and composition, wherein second ferrite core piece 302b is adapted to be mated to first ferrite core piece 302a for use as an inductor in an LC demodulation filter according to aspects of the embodiments. As shown in FIG. 5, there is a portion of WCA channel 404a that exhibits a substantially constant radius $R_{CH}$ (channel radius $R_{CH}$). In FIG. 5 it can also be seen that center post 406a comprises a substantially constant radius $R_{CP}$ (center post radius $R_{CP}$). FIG. 6 illustrates cross sectional view of first ferrite core piece 302a along line A-A of FIG. 4 according to aspects of the embodiments.

FIG. 7 illustrates a bottom view of mated first and second ferrite core pieces 302a,b of ferrite core inductor assembly (inductor) 300 without WCA 304 according to aspects of the embodiments. First and second ferrite core pieces 302a,b mate with each other via substantially planar mating surfaces 410a,b. The space between center posts 406a,b can be referred to as center post gap 702 according to aspects of the embodiments.

FIG. 8 illustrates a perspective view of a mating surface of the first ferrite core piece 302a as shown in FIG. 4 with WCA 304 inserted thereto for use as an inductor 300 in an LC demodulation filter according to aspects of the embodiments. WCA 304, along with first and second ferrite core pieces 302a,b can be assembled into inductor 300 for use in an LC demodulation filter that can then be used in audio devices, as described above. First and second ferrite core pieces 302a,b can be joined together in numerous ways, as shown in FIG. 3 with epoxy 308.

As those of skill in the art can appreciate, it is advantageous to use a ferrite core material formulation in inductor 300 that is specifically manufactured for lowest losses at the Class-D switching frequency employed in amplifier designs. Typically, one such switching frequency is a fixed frequency of about 400 KHz for fixed frequency designs. An additional range of switching frequencies is used for variable frequency designs, and those switching frequencies range from between about 100 KHz to about 800 KHz for the variable frequency designs. As those of skill in the art can further appreciate, it is known that one or more such ferrite core material formulations can exhibit better characteristics in fixed frequency designs versus use in variable switching designs, and visa-versa. By way of non-limiting examples, such formulations can include such formulations are manufactured by FerroxCube, a company at present owned by the Chilisin Group, a suppler of passive components. The formulation names (e.g., "3C90" may be protected as Trademarks in one or more countries, including the U.S. These formulations include: 3C90 (a low frequency formulation for use up to about 200 kHz); 3C91 (a medium frequency formulation for use up to about 300 kHz); 3C92 (a low frequency formulation for use up to about 200 kHz); 3C93 (a medium frequency formulation for use up to about 300 kHz); 3C94 (a medium frequency formulation for use up to about 300 kHz); 3C96 (a medium frequency formulation for use up to about 300 kHz); 3F3 (a high frequency formulation for use up to about 700 kHz); 3F35 (a high frequency formulation for use up to about 1 MHz); 3F4 (a high frequency formulation for use up to about 2 MHz); 3F45 (a high frequency formulation for use up to about 2 MHz); 3F5 (a high frequency formulation for use up to about 4 MHz); and 4F1 (a high frequency formulation for use up to about 10 MHz).

FIG. 9 illustrates a perspective view of a mating surface of the first ferrite core piece 302a with WCA 304 inserted thereto for use as an inductor 300 in an LC demodulation filter and base plate 902 according to aspects of the embodiments. Both first and second halves 302a,b are formed in a generally rectangular shape that provides for easy packing in multi-channel implementations that require many identical inductors to be packed in an arrangement so as to minimize the amount of printed circuit board (PCB) area used. This simple shape is also advantageous in that it allows for the possibility of adding a separate bottom ferrite shielding plate, base plate 902, as shown in FIG. 9. One purpose of providing base plate 902 is that in conjunction with the ferrite core material that makes up first and second halves 302a,b a substantially complete magnetic shield is provided in all directions around WCA 304. The substantially complete magnetic shielding afforded by this design substantially lessens or prevents electromagnetic interference (EMI) radiation problems as well as crosstalk issues that can occur when there are multiple independent channels packed tightly together on a single PCB. This allows denser packaging of inductors 300, with substantially reduced crosstalk issues. According to further aspects of the embodiments, use of base plate 902, with holes for first and second leads 306a,b to pass through, eliminates the need for adhesive to secure and locate WCA 304 with respect to inductor 300. Base plate 902 can be either non-magnetic, such as a fiberglass material, or can be made up of a substantially similar ferrite material as what is used for first and second ferrite core halves 302a,b, for a substantially complete magnetic shielding of WCA 304. According to further aspects of the embodiments base plate 902 further functions to lock WCA 304 in the correct position vertically within WCA channel 404.

Attention is directed to FIGS. 10, 11A, and 11B: FIG. 10 illustrates a sectional view along line B-B of FIG. 8 of first ferrite core piece 302a of WCA 304; FIG. 11A illustrates a cross sectional view of WCA 304 when un-compressed; and FIG. 11B illustrates a cross sectional view of WCA 304 when compressed for insertion into first or second half of ferrite for 302a,b, according to aspects of the embodiments.

According to aspects of the embodiments, a suitable length of flat magnet wire 305, made from predetermined materials, exhibiting the correct and known properties, with the proper dimensions, can be formed into a coil shaped assembly, much like in the form factor of a spring, to be used as WCA 304 in inductor 300 in the LC demodulation filter. When assembled, WCA 304 is in the form factor of a substantially cylindrical arrangement of flat magnet wire, layered in a spiral manner, with a substantially constant inner and outer radius, such that a substantial majority of the wire core assembly is of substantially uniform appearance and dimensions. According to aspects of the embodiments, use of flat magnet wire provides for additional turns of wire in a given length of wire versus that of a round wire. Flat wire versus round wire provides a greater cross sectional area of copper for lower DC resistance versus that of round wire.

As shown in FIGS. 5 and 10, an outer portion of center post 406, which can also be referred to as inner wall of WCA channel 412, has a substantially constant radius, $R_{CP}$, and about 50 percent of outer wall of WCA channel 414 is located at a substantially constant fixed radius $R_{CH}$, as measured from a center point of center post 406 (shown in FIG. 10). As shown in FIG. 11A, in an un-compressed state, WCA 304 is formed with a substantially constant outer radius $R_{WCA-O-U}$, which is just a bit larger than $R_{CH}$; the reason for the outer radius of WCA 304 in an uncompressed state ($R_{WCA-O-U}$) being a bit larger than radius $R_{CH}$ ($R_{WCA-O-U} > R_{CH}$) is to ensure a secure fit of WCA 304 within WCA channel 404; when WCA 304 is ready to be inserted into WCA channel 404 (of either first or second ferrite core piece 302a,b), WCA 304, because of the spring like tendencies that have been incorporated into it by the manner in which it is made, can be compressed slightly by forcing leads 306a,b together (e.g., pushing leads 306a,b towards each other in the direction of arrows C, as shown in FIG. 11A), which then reduces the outer radius just enough to $R_{WCA-O-C}$, so that WCA 304 can fit into WCA channel 404. The compression of WCA 304 occurs when leads 306a,b are pushed together to a first separation distance, $S_D$. That is, as shown in FIG. 11B, the compressed outer radius of WCA 304, $R_{WCA-O-C}$ is less than $R_{CH}$ ($R_{WCA-O-C} < R_{CH}$); when released from its compressed state to its uncompressed state (FIG. 11B to FIG. 11A), WCA 304 then fits snugly within WCA channel 404, and creates a maximum spacing between inner radial surface 1004 of WCA 304 and inner wall 412 of WCA channel 404.

When leads 306a,b are released, WCA 304—specifically, main winding area 307—attempts to return to its original dimensions, and thus main winding area 307 is forced outwardly by the spring-like characteristics imbued into WCA 304 when formed in the manner that it has been formed in. As those of skill in the art, especially in regard to material sciences, can appreciate, depending on the dimensions, materials, and form, fitting one object within another in the manner as described herein, will necessarily proscribe a set of dimensions that allows such insertion and securing to be accomplished. As those of skill in the art can therefore, appreciate, it is not necessary, nor reasonably possible, to enumerate such dimensions in view of the wide variety of materials that can now, or in the future, be used to manufacture such aspects of the embodiments, as described herein. According to further aspects of the embodiments, other shapes can be used as opposed to a cylindrically wrapped WCA 304; however, with the use of substantially flat magnet wire and the features and advantages as described above, it is substantially easier to wind the flat magnet wire in the cylindrical shape as shown in the accompanying figures.

As WCA 304/main winding area 307 attempts to return to its original dimensions, it is kept under tension and retained by outer wall of WCA channel 414, such that substantially uniform wire core space (wire core space) 804 is formed between inner radial surface of WCA 1004 and inner wall of WCA channel 412 according to aspects of the embodiments.

The spatial relationships between inner wall of WCA channel 412, outer wall of WCA channel 414, outer radial surface of wire core assembly 1002, and inner radial surface of wire core assembly 1004 of inner wall of WCA 304 are shown in detail in FIGS. 10, 11A, and 11B.

According to aspects of the embodiments, therefore, when inserted into either first or second half ferrite core 302a,b, wire core assembly 304 forms a substantially self-locating, self-centering, substantially rigid winding using a single layer winding of flat magnet wire 307, optimally dimensioned with respect to the dimensions of first and second half of ferrite core 302a,b and the dimensions of wire core space 804 to provide for a maximized spacing between center post 406 and WCA 304, to substantially prevent/reduce eddy current losses in WCA 304.

Attention is now directed to FIGS. 12 and 15, the former of which illustrates a cross sectional view of inductor 300 along lines A-A of FIG. 3 according to aspects of the embodiments, and the latter of which illustrates an expanded cross sectional view of a portion of inductor 300 along lines A-A of FIG. 3 showing several dimensions according to aspects of the embodiments. Shown in FIG. 12 are fringing flux 1202 and center flux 1204. As those of skill in the art can appreciate, when fringing flux impinges on winding turns that are too close to a core gap as is the case with the conventional devices shown in FIGS. 1 and 2, eddy currents will begin to flow in the copper windings, and this, in turn, will cause heating and power loss in the windings. FIG. 15 illustrates a first distance $X_1$ between center posts 406a,b and WCA 304, and a second distance $X_2$ between the two center posts 406a,b. The distance $X_2$ can be referred to as the gap length. Gap length $X_1$ and other center post 108 dimensions in combination with the number of turns of magnet wire 305 in WCA 304 substantially determines the inductance value of inductor 300. As those of skill in the art can appreciate, the distance $X_1$ should be greater than or equal to the distance $X_2$ in order to substantially minimize eddy current and power losses due to fringing flux 1202. According to aspects of the embodiments, gap length $X_1$ should be great enough such that little or no fringing flux 1202 reaches WCA 304. As those of skill in the art can appreciate, a gap length does need to exist for ferrite inductors.

According to aspects of the embodiments, the design of WCA 304 substantially locks WCA 304 into WCA channel 404 upon insertion such that it is substantially self-locating and substantially self-centering with respect to WCA channel 404 and center post 406, forming wire core space 804. According to aspects of the embodiments, wire core space 804 is a maximally large and substantially uniform space that be maintained between WCA 304 and center post 306 such that eddy current losses can be minimized. According to further aspects of the embodiments, the self-locating and self-centering feature saves labor and materials that would otherwise be necessary to secure WCA 304 into place, as is done in prior art devices. These aspects of the embodiments are illustrated in FIG. 12. FIG. 12 illustrates a cross sectional view of inductor 300 along lines A-A of FIG. 3 according to aspects of the embodiments. Shown in FIG. 12 is center flux 1204 that passes through center post gap 702 between center posts 406a,b, and fringing flux 1202 that passes within wire core space 804 but not in WCA 304 between inner walls 412 of center posts 406, according to aspects of the embodiments. As can be seen in FIG. 12, center flux 1204 travels in a substantially straight path between first center post 406a and a second opposite center post 406b through center post gap 702; this is typical of most all gapped inductors, regardless of how they are constructed. Similarly, the path travel of fringing flux 1202 are substantially similar in other similarly constructed inductors. However, because of the novel and unobvious manner in which inductor 300 is constructed according to aspects of the embodiments, fringing flux 1202 does not encounter flat magnet wire 305 of WCA 304. That is, because WCA 304 is pressed against outer wall 414, there is a maximum amount of space in WCA channel 404, and so fringing flux 1202 does not encounter flat magnet wire 305 and does not create eddy currents, which in turn does not create power losses due to current and resistance, commonly referred to as "$I^2R$" losses. Such losses reduce the efficiency of an inductor.

According to further aspects of the embodiments, WCA 304 comprises multiple turns of substantially flat magnet wire 305. Use of flat magnet wire 305 allows for more turns per winding length than round magnet wire of comparable cross-sectional area. In addition, flat magnet wire 305 provides a substantially more rigid finished winding that can hold its shape. Consequently, WCA 304 that is made of flat magnet wire 305 can be precisely dimensioned such that it can be inserted between first and second ferrite core halves 302a,b and become self-centered about center-post 406 to form wire core space 804.

As those of skill in the art can appreciate, the inductive and other electrical characteristics of a ferrite core based assembly derives, in part, not only from the shape and type of ferrite used in inductor 300, but also the electrical and physical characteristics of WCA 304. That is, if the same basic shape, dimensions, and number of turns were kept constant of WCA 304, but the type of wire changed, or the way the winding turns are arranged were changed then the inductance value (henry) of the assembly would change, as would other critical electrical characteristics such s the shunt capacitance of the winding. As those of skill in the art can appreciate, changing any one of those characteristics, and the inductance value changes, and other electrical characteristics can be degraded.

According to aspects of the embodiments, therefore, the result of making an inductor 300 with one or more of the aforementioned features are substantially reduced core losses, winding losses, and eddy current losses. According to further aspects of the embodiments, the result of making an inductor 300 with one or more of the aforementioned features are reduced costs associated with the construction of inductor 300, and additional cost savings in terms of PCB area used and packing density optimization of multiple parts on a single PCB.

INDUSTRIAL APPLICABILITY

To solve the aforementioned problems, the aspects of the embodiments are directed towards systems, methods, and modes for manufacturing an inductor for use in an LC filter in a Class D audio amplifier that can be used either with a fixed switching frequency category of Class D amplifier, or a variable switching frequency design category of Class D amplifier, according to aspects of the embodiments.

FIG. 13 illustrates a close up view of Area A shown in FIG. 11B of two layers of WCA 304 according to aspects of the embodiments. FIG. 13 illustrates a cross sectional view of two layers of flat magnet wire 305a,b, and the components of each layer of wire 305. Flat magnet wire 305 has four sides, $S_{1-4}$, and is covered with insulation 1302. Sides $S_1$ and $S_3$ are substantially parallel to each other, and shorter in length than sides $S_2$ and $S_4$, which also are substantially parallel to each other. In addition, each of the sides are substantially perpendicular to each other.

FIG. 14 illustrates a flow diagram of a method for assembling inductor 300 (method 1400) according to aspects of the embodiments. Method 1400 begins with method step 1402, in which at least a first and second ferrite core piece are obtained. In method step 1404, at least one wire core assembly 304 is obtained. As those of skill in the art can appreciate, the step of obtaining can also include making or forming the object (e.g., making/forming WCA 304). Following step 1404, method 1400 moves to method step 1406, in which WCA 304 is compressed according to the process as described herein, in which first and second leads 306a,b are forced towards each other, and WCA 304 in general, and more specifically main winding area 307, compresses from a first outer radius, RWCA-O-U, to a smaller outer radius, RWCA-O-C, such that it can fit within WCA channel 404. In method step 1408, compressed WCA 304 is then inserted into WCA channel 404 and in method step 1410, the compression is released. Releasing the compression force then causes compressed WCA 304 to attempt to return towards its natural state and original uncompressed outer radius RWCA-O-U. However the relaxed outer radius of WCA 304 is just larger than the radius of the curved/substantially circular portion of WCA channel 404, RCH, and thus outer radial surface 1002 of WCA 304 is forced against the substantially curved portion of outer wall 414. WCA 304 is now substantially locked into channel 404, and in doing so has self-centered itself about center post 406 and created wire core space 804, as described in greater detail above, according to aspects of the embodiments. WCA 304 is still compressed slightly, albeit in a small amount, so that WCA 304 fits securely within channel 404, and maximizes the distance of core space 804. Such distance is shown and described in regard to FIG. 15, and is denoted as $X_1$; $X_1$ needs to be large enough so that fringing flux 1202 does not impact or contact WCA 304, and thereby created eddy currents, and the losses/inefficiencies that such currents would incur.

Following method step 1410, method 1400 proceeds to method step 1412, wherein the remaining ferrite core piece 302 is joined with the ferrite core piece 302 that now contains WCA 304. Joining can be secured by epoxy 308 and/or tape (not shown).

As discussed in regard to FIGS. 3-12, reference is made to relative positions between components of inductor 300, as well as measurements of different electrical characteristics of an inductor and LC filter for use in a Class D audio amplifier according to aspects of the embodiments. Those of skill in the art can appreciate that although examples of relative positions and electrical measurements are provided, these should not be taken in a limiting manner; that is, the aspects of the embodiments are not to be construed as defined or limited by the specific example of the relative positions and electrical measurements shown and discussed, but instead are provided merely for illustrating an example of what an inductor that incorporates the aspects of the embodiments could, in a non-limiting manner, look and perform like. Furthermore, as those of skill in the art can appreciate, since the aspects of the embodiments are directed towards a physical object, with dimensional and relative positional characteristics, all of the parts will have various dimensions and relative positions, some of which are not shown in fulfillment of the dual purposes of clarity and brevity. According to still further aspects of the embodiments, some of these objects will have dimensional and relative positional characteristics that lend themselves to aesthetic aspects; in fulfillment of the dual purposes of clarity and brevity, dimensions in this regard have also been omitted. Therefore, as the aspects of the embodiments are directed towards an inductor for use in a Class D audio amplifier, it is to be understood that the relative positions and electrical measurements of the different objects, some of which are shown and discussed, and some of which are not, will be understood by those of skill in the art.

It should be understood that the afore-provided description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

All United States patents and applications, foreign patents, and publications discussed above are hereby incorporated herein by reference in their entireties.

Alternate Embodiments

Alternate embodiments may be devised without departing from the spirit or the scope of the different aspects of the embodiments.

What is claimed is:

1. An audio amplifier, comprising:
    circuitry adapted to receive an audio signal, amplify the same, and output the amplified audio signal, the circuitry comprising at least one inductor, the inductor comprising
        a first ferrite core piece and a second ferrite core piece, each of which are made of substantially similar materials, exhibit desired electromagnetic properties, and which are fashioned in a substantially similar manner and shape, and wherein
        each of the first and second ferrite core pieces comprises
            a substantially planar mating surface,
            a center post, and
            a wire core assembly channel, and wherein
                a first substantially planar mating surface of the first ferrite core piece is adapted to planarly mate with a second substantially planar mating surface of the second ferrite core piece; and a wire core assembly adapted to be substantially self-locating and self-centering about a first or second center post when located in a respective first or second wire core assembly channel.

2. The audio amplifier according to claim 1, wherein the wire core assembly channel comprises:
an inner wall;
an outer wall; and
a substantially planar channel surface, and wherein
the wire core assembly is further adapted to form a substantially uniform wire core space between an inner radial surface of the wire core assembly and the inner wall.

3. The audio amplifier according to claim 2, wherein
each respective center post has a radius, RCP, the center post located in the substantially planar channel surface, and having a substantially planar center post upper surface that is located between the substantially planar channel surface and the substantially planar mating surface.

4. The audio amplifier according to claim 2, wherein
the outer wall rises from the substantially planar channel surface to the substantially planar mating surface, and wherein
the inner wall rises from the substantially planar channel surface to the substantially planar center post upper surface thereby forming the center post.

5. The audio amplifier according to claim 2, wherein
about fifty percent of the outer wall is substantially circular with a radius RCH about the center of the center post.

6. The audio amplifier according to claim 2, wherein
the wire core assembly, when located in the channel, is adapted to form the substantially uniform core space that is a maximum and substantially constant distance between the inner radial surface of the wire core assembly and the inner wall.

7. The audio amplifier according to claim 1, wherein the wire core assembly comprises:
a substantially cylindrical arrangement of a length of flat magnet wire, wound in a single layer, spiral manner, with a substantially constant inner and outer radius, such that a substantial majority of the wire core assembly is of substantially uniform appearance and exhibits substantially uniform magnetic characteristics; and
a first lead portion and a second lead portion, the first and second lead portions located at a first end and second end of the length of flat magnet wire respectively, the lead portions adapted to be connected to external circuitry.

8. The audio amplifier according to claim 7, wherein the wire core assembly comprises:
spring like characteristics such that when the first and second leads are pushed towards each other to a first separation distance, the outer radius of the wire core assembly reduces enough such that the wire core assembly can be located within the wire core assembly channel.

9. The audio amplifier according to claim 8, wherein
the outer radius of the uncompressed wire core assembly, RWCA-O-U, is larger than the radius of the wire core assembly channel, RCH, such that when the first and second leads are allowed to return to their uncompressed state, the wire core assembly expands to fit substantially immovably against the outer wall.

10. The audio amplifier according to claim 7, wherein
the substantially uniform magnetic characteristics includes one or more of low shunt capacitance and interwinding capacitance.

11. The audio amplifier according to claim 7, further comprising:
a base plate adapted to provide through-holes for the first and second lead portions.

12. The audio amplifier according to claim 11, wherein
the base plate is made of a substantially similar ferrite material as the first and second core pieces.

13. The audio amplifier according to claim 1, wherein
the inductor is adapted to be used in a low pass audio frequency filter.

14. The audio amplifier according to claim 13, wherein
the low pass audio frequency filter is an inductor-capacitor filter.

15. The audio amplifier according to claim 1, wherein
the inductor is adapted to be used in a low pass audio frequency filter (LPF), and wherein
the LPF is adapted to remove high frequency constant switching frequency components, and wherein
the switching frequency is about 400 KHz.

16. The audio amplifier according to claim 15, wherein
the ferrite core pieces are fabricated from a first ferrite material composition selected for low hysteresis loss when the inductor is operating at the switching frequency of about 400 kHz.

17. The audio amplifier according to claim 1, wherein
the inductor is adapted to be used in a low pass audio frequency filter (LPF), and wherein
the LPF is adapted to remove high frequency variable switching frequency components, and wherein
the variable switching frequency ranges from about 100 kHz to about 800 kHz.

18. The audio amplifier according to claim 17, wherein
the ferrite core pieces are fabricated from a second ferrite material composition selected for low hysteresis loss when the inductor is operating at the variable switching frequency that ranges from about 100 kHz to about 800 kHz.

* * * * *